(12) United States Patent
Obermaier

(10) Patent No.: US 6,185,104 B1
(45) Date of Patent: Feb. 6, 2001

(54) ON-LINE REPLACEMENT APPARATUS FOR PRINTED CIRCUIT CARDS

(75) Inventor: Hannsjorg Obermaier, Los Gatos, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/220,647

(22) Filed: Dec. 24, 1998

(51) Int. Cl.⁷ ...................................................... H05K 5/00
(52) U.S. Cl. ........................ 361/759; 361/756; 361/801; 361/802; 439/259; 439/260
(58) Field of Search ................... 361/756, 759, 361/752, 753, 801, 802; 439/259, 260, 267, 342, 377

(56) References Cited

U.S. PATENT DOCUMENTS

| | | | | |
|---|---|---|---|---|
| 4,352,536 | * | 10/1982 | Goldberg | 439/260 |
| 4,548,452 | * | 10/1985 | Gillett | 439/260 |
| 4,743,203 | * | 5/1988 | Grabbe | 439/260 |
| 4,999,787 | | 3/1991 | McNally et al. | |
| 5,238,423 | * | 8/1993 | Hillis et al. | 439/259 |
| 5,712,754 | | 1/1998 | Sides et al. | |
| 5,815,377 | * | 9/1998 | Lund et al. | 361/802 |
| 5,980,282 | * | 11/1999 | Cheng | 439/157 |
| 6,038,131 | * | 3/2000 | Valosen et al. | 361/756 |

FOREIGN PATENT DOCUMENTS

| | | | |
|---|---|---|---|
| 0 350 674 A3 | 1/1990 | (EP) | G08F/11/00 |
| 0 802 487 A2 | 10/1997 | (EP) | G06F/13/40 |
| 0 811 931 A2 | 12/1997 | (EP) | G06F/13/40 |
| 0 811 931 A3 | 12/1997 | (EP) | G06F/13/40 |
| 0 811 932 A1 | 12/1997 | (EP) | G06F/13/40 |

* cited by examiner

Primary Examiner—Jayprakash N. Gandhi
Assistant Examiner—Tuan Dinh

(57) ABSTRACT

An improved apparatus is disclosed for removing and installing faulty printed circuit cards laterally through a side wall of a computer system, while the remaining cards of the computer system remain under power and operational. The computer system incorporates zero insertion force (ZIF) connectors for receiving the printed circuit cards, and a special interlock mechanism prevents each ZIF connector from being moved from its open position to its closed position until an associated card has been fully installed into the connector. In addition, a special centering mechanism is used to adjustably position the printed circuit card with its electrical contacts precisely aligned with the contacts of the ZIF connector.

20 Claims, 4 Drawing Sheets

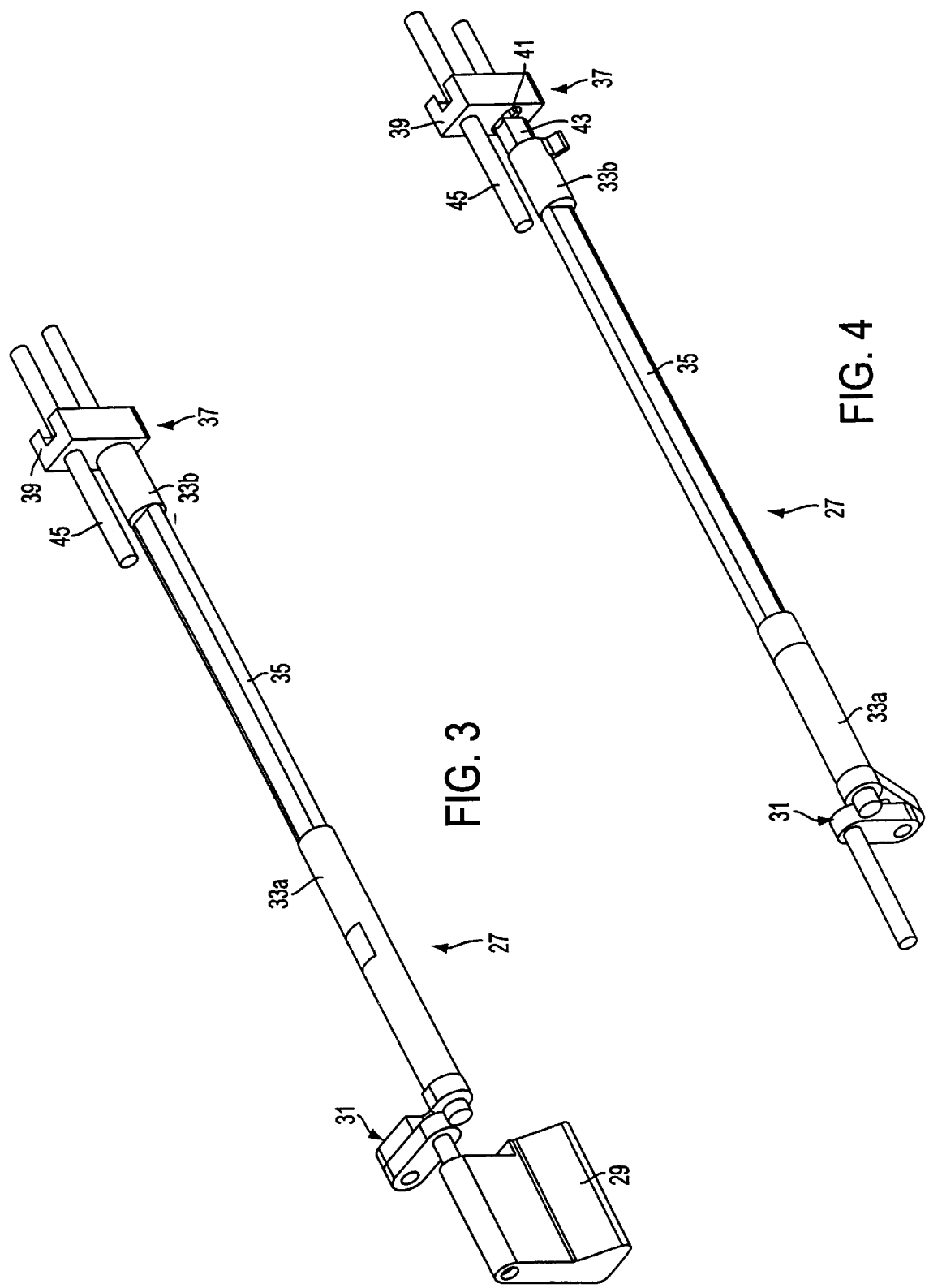

ON-LINE REPLACEMENT APPARATUS FOR PRINTED CIRCUIT CARDS

BACKGROUND OF THE INVENTION

This invention relates generally to methods and apparatus for removing and installing printed circuit boards from/into computer systems and the like and, more particularly, to methods and apparatus of this kind in which the printed circuit boards are extracted and installed laterally from a multi-card chassis without the need to disassemble the system, disturb other cards, or disrupt electrical power from being applied to the chassis.

Personal computers (PCs), PC servers, UNIX servers, and other computer systems typically incorporate chassis that carry a number of printed circuit boards, including input/output (I/O) cards, in connectors arranged in spaced, parallel relationship on a mother board or other support structure. Computer systems of this kind typically incorporate printed circuit boards or cards that are compatible with the standardized Peripheral Component Interconnect (PCI) bus. PCI cards have variable heights and widths, but all have a multiple-contact connector along their lower edges and a bulkhead mounted along an adjacent side edge.

Computer systems of the kind described above typically must be powered down while a faulty PCI card is being removed and replaced. In addition, in many instances, more than just a single card must be removed, because a small-outline card might be located adjacent to one or more full-size cards and thus be inaccessible. This card replacement procedure has proven to be lengthy and disruptive, and it has given rise to the need for a means that allows such cards to be removed and replaced without having to shut down electrical power to the remainder of the system. This is referred to as On-Line Replacement (OLR).

A fully capable OLR system includes OLR hardware, system software and OS support, device drivers, and a user interface. The hardware and software function together to ensure that any OLR activity is benign to other devices connected to the PCI bus. Typically, the PCI OLR hardware isolates the logic and the power signals of a single PCI slot from all other devices connected to the PCI bus. A digital OLR controller arbitrates for the PCI bus and controls all of the logic signals for each slot. Power control electronics allows for power sequencing on the PCI bus, ensuring that power to the card slot is switched off for on-line replacement, while stable power continues to be delivered to other devices on the PCI bus.

OLR solutions have been provided in the past by systems compatible with other industry standards, including VME or Compact-PCI cards, which are of a fixed size, or at most two fixed sizes. In these other systems, the cards are configured to be supported by card guides such that they can be removed and installed without contacting neighboring cards. Typically, the bulkheads of such cards are oriented orthogonal to the direction of extraction, and they incorporate handles and latches, for convenient replacement.

In contrast with the cards of such other industry standards, standard PCI cards are not of a fixed size, but instead have upper and rearward side edges with widely variable positions. In addition, the bulkhead of a PCI card is in line with the normal direction of extraction and is free of handles or other detail for facilitating its extraction. The force required to insert a 64-bit PCI card into a standard connector can be as high as 60 pounds.

Some OLR systems have been devised for use with PCI cards, but they are not considered to be entirely satisfactory. For example, one such system incorporates special adapters and handles, while another incorporates special dividers and guides, along with handles for accommodating size variations and obviating potential electrical shorting of adjacent cards. These known OLR systems for use with PCI cards use standard connectors and maintain a standard extraction procedure, in line with the bulkhead. This generally requires a removal of covers and/or drawers to gain access to the card cage.

It should therefore be appreciated that there is a need for an improved OLR system for use with PCI cards and the like, which facilitates a safe and convenient removal and replacement of the cards in a lateral direction and without requiring a shutdown of electrical power to any other cards. The present invention fulfills this need.

SUMMARY OF THE INVENTION

The present invention is embodied in an improved on-line replacement apparatus for removing and installing a printed circuit card from and into a computer system, laterally through a side wall, while other components of the system remain powered and operational. The printed circuit card has a lower edge, an upper edge, and a side edge, with a multiple-contact connector located along its lower edge and a bulkhead located along its side edge. The apparatus includes a chassis connector mounted on the chassis and having a plurality of electrical contacts that define a slot for receiving the lower edge of the printed circuit card. These chassis connector contacts are movable between a retracted position, in which the lower edge of the printed circuit card can be slid along the slot for removal and installation, and an engagement position, in which the chassis connector contacts make electrical contact with the card's multiple-contact connector and secure the card in place. The apparatus further includes a control lever for selectively moving the chassis connector contacts between their retracted and engagement positions, and a mechanical interlock for preventing the control lever from moving those contacts from their retracted position to their engagement position unless the printed circuit card has been fully inserted.

In more detailed features of the invention, the control lever includes an elongated rod mounted for rotation adjacent to the chassis connector contacts, and this rod is configured such that rotation of the rod about its longitudinal axis moves the chassis connector contacts between their retracted and engagement positions. The elongated rod preferably incorporates a section with a uniform, substantially oval cross-section, configured to engage the chassis connector contacts. In addition, the mechanical interlock preferably includes a block mounted on the chassis, adjacent to the chassis connector, and movable between a forward position and a retracted position, and it further includes a spring that biases the block to its forward position. Installing the printed circuit card into its prescribed installation position automatically moves the block to its retracted position, against the yielding bias of the spring. The mechanical interlock is configured to prevent the control lever from moving the chassis connector contacts to their engagement position while the block is in its forward position.

In a separate and independent feature of the invention, the apparatus includes a centering device, operable when the printed circuit card has been fully inserted into the chassis connector, for adjustably positioning the card such that its contacts are aligned with the corresponding chassis connector contacts. This centering device can include a spring-biased pin configured to engage and to center a key slot formed in the lower edge of the printed circuit card. The pin preferably is biased substantially orthogonal to the axis of the chassis connector slot; and it incorporates a conical section configured to engage the key slot of the printed circuit card and thereby adjustably position the printed circuit card in a prescribed installation position.

In yet another feature of the invention, the apparatus further includes an elongated card guide pivotally mounted on the computer system's side wall and biased, e.g., by a spring, toward the chassis. The card guide incorporates a slot configured to engage and retain the upper edge of a printed circuit card of varying height. This prevents the card from tilting toward an adjacent card, which could inadvertently short out electrical components on that adjacent card.

Other features and advantages of the present invention should be apparent from the following description of the preferred embodiment, taken in conjunction with the accompanying drawings, which illustrate, by way of example, the principles of the invention.

BRIEF DESCRIPTION OF THE DRAWINGS

FIG. 3 is an isometric view of the actuator of one on-line replacement apparatus of FIG. 1, shown in its open position, in which the associated PCI card can be freely removed from, or replaced into, the associated chassis connector.

FIG. 4 is an isometric view of the actuator of FIG. 3, but shown with its manual control handle removed and in its closed position, in which the associated PCI card is secured in the associated chassis connector.

DESCRIPTION OF THE PREFERRED EMBODIMENT

Figure 1:
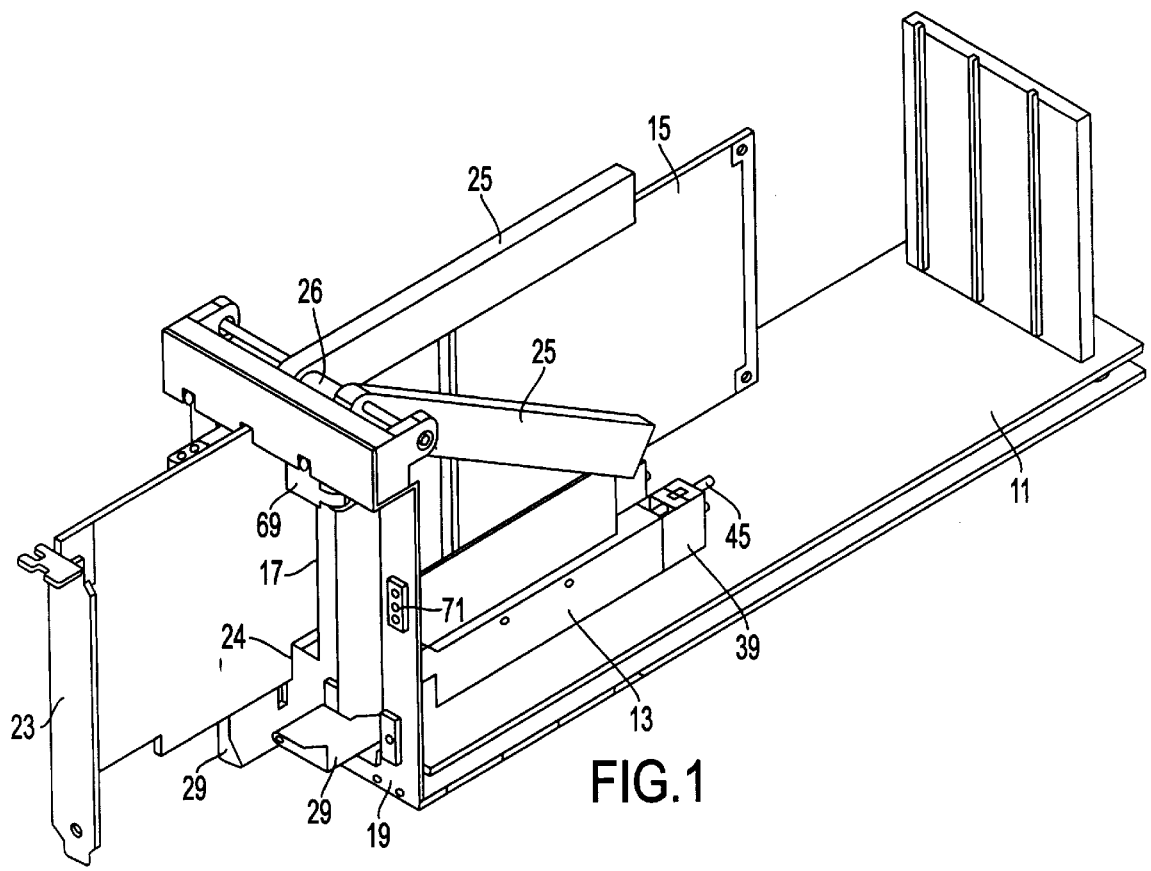
FIG. 1 is an isometric view of one embodiment of an on-line replacement apparatus in accordance with the invention, for use in removing and installing PCI-type printed circuit cards into one of a series of chassis connectors of a computer system, via a side wall of the computer system's housing. A major portion of the housing is broken away to reveal the on-line replacement apparatus, with one card being shown part way through its installation.
Figure 2:
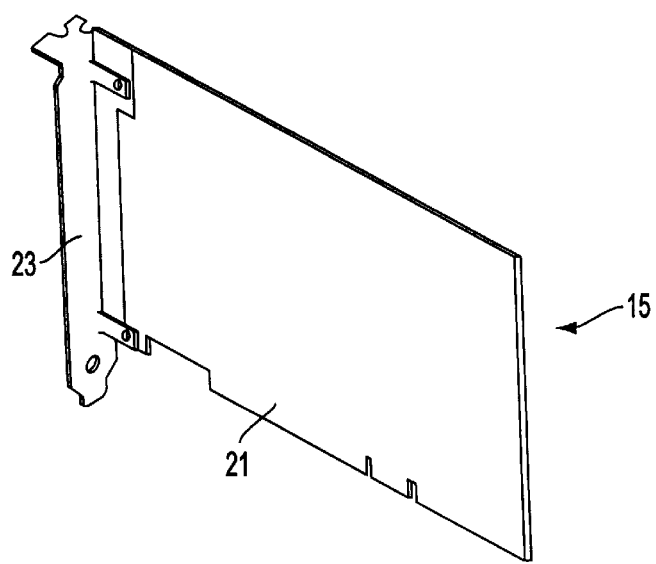
FIG. 2 is an isometric view of one typical PCI card that can be removed and installed using the apparatus of FIG. 1.

With reference now to the illustrative drawings, and particularly to FIGS. 1 and 2, there is shown a computer system housing 11 that carries several electrical connectors 13, each for receiving a separate printed circuit board or card 15. Each such connector incorporates a separate card replacement apparatus configured to remove the card from, and/or install the card into, the connector. This removal and installation is achieved laterally, via an opening 17 in a side wall 19 of the housing.

Each of the printed circuit cards 15 is configured to be compatible with the standardized Peripheral Component Interconnect (PCI) bus. Such PCI cards have heights and widths that are variable, and each incorporates a multiple-contact connector 21 located along its lower edge and a bulkhead 23 mounted along an adjacent side edge. The connector 21 has the form of metal contact arrays deposited onto the opposite sides of the card's lower edge. In the past, such cards typically have been installed by lowering them orthogonally into mating connectors and then fastening the card's bulkhead to an adjacent wall. This procedure has not been entirely satisfactory, because it generally has required a removal of covers and/or drawers to gain access.

The connectors 13 carried within the computer system housing 11 each have a zero insertion force (ZIF) configuration, with facing arrays of spring-biased contacts (not shown in the drawings). The facing contact arrays are selectively movable between a retracted (or open) position, and an engagement (or closed) position. In the open position, the arrays are spaced apart to form a slot 24 sized to allow the connector 21 of a PCI card 15 to be freely removed or installed. Conversely, in the closed position, the arrays are moved toward each other, into compressive engagement with the contacts of the card connector.

The card slot 24 defined in each ZIF connector 13 extends to the end of the connector adjacent to the side wall 19. This defines an opening that permits PCI card to be conveniently slid laterally into and out of the slot when the ZIF connector is in its open position. To this end, the openings 17 defined in the side wall will are aligned with the successive ZIF connectors. When fully inserted, each card's bulkhead 23 is substantially flush with the side wall, where it can be secured in place, as is described below.

With particular reference to FIG. 1, the on-line replacement apparatus further includes a card guide 25 having a channel (not shown) on its underside, for receiving and guiding the upper edge of the PCI card 15 during the card's removal and replacement. This prevents the card from tilting toward an adjacent card, which ordinarily would still be receiving electrical power even when the card in question is being removed and replaced. Such contact could inadvertently short out electrical components on that adjacent card.

The card guide 25 is pivotally mounted on a pivot rod 27 positioned on the housing's side wall 19 above the openings 17. When a PCI card 15 is first installed, the card guide will be initially engaged by the upper corner of the card's leading edge, and further insertion of the card will pivot the card guide upwardly. The pivotal mounting ensures that at least the remote end of the card guide will engage and retain PCI cards of all conventional heights. A spring 26 biases the card guide toward the ZIF connector 13, to ensure engagement with the PCI card even for horizontal installations.

The ZIF connector 13 is selectively moved between its open and closed positions using an elongated actuator 27 (FIGS. 3 and 4), which is mounted for rotation within the connector, itself. A manual control handle 29 and linkage 31 are secured to the end of the actuator adjacent to the side wall 19, for use in manually pivoting the actuator between its open and closed positions. Opposite end portions 33a and 33b of the actuator have circular cross-sections that are journaled within correspondingly sized cylindrical recesses formed in the ZIF connector 13. This maintains the actuator's alignment when it is being rotated between its open and closed positions.

A mid-portion 35 of the actuator 27, which has a generally oval-shaped cross-section, is located immediately beneath the slot 24 defined between the ZIF connector's facing arrays of contacts. When the actuator is rotated to its open position (FIG. 3), the long dimension of this oval cross-section is aligned horizontally, which functions to space apart the contact arrays of the connector, to form the slot for receiving the connector 21 at the lower edge of the PCI card 15. On the other hand, when the actuator is rotated to its closed position (FIG. 4), the long dimension of the oval cross-section is aligned vertically, which allows the contact arrays to move toward each other, to secure the PCI card in place.

The ZIF connector 13 further incorporates an interlock mechanism 37 for preventing the actuator 27 from being rotated from its open position to its closed position until a PCI card 15 has been fully inserted into the ZIF connector. This prevents the facing contact arrays of the ZIF connector from electrically contacting the contacts of the card connector 21 until the contacts are appropriately aligned.

More particularly, the interlock mechanism 37 includes a spring-biased block 39 located adjacent to the actuator's inner end. An oval-shaped recess 41 is formed in the block, and a similarly sized and shaped oval-shaped projection 43 is formed at the actuator's inner end. The long dimension of the oval-shaped recess is oriented generally horizontally, and the long dimension of the oval-shaped projection is oriented generally horizontally when the actuator is in its open position and vertically when the actuator is in its closed position. A suitable spring (not shown in the drawings) biases the block axially toward the actuator 27, such that the block's oval-shaped recess conformably slides over the actuator's oval-shaped projection if the actuator is in its open position. With the recess and projection in this conforming engagement, the actuator is effectively prevented from being rotated to its closed position.

The block's oval-shaped recess 41 and the actuator's oval-shaped projection 43 are moved out of engagement with each other when the PCI card 15 has been fully inserted into the ZIF connector 13. This movement out of engagement is achieved by means of a rod 45 that is secured to the block 39 in a position where it is engaged by a leading edge of the PCI card as the card is being installed. During the last part of the card's installation, the card's leading edge moves the rod and block rearwardly, away from the actuator 27. When the card has been fully inserted into the ZIF connector, the rod and block will have been moved rearwardly sufficiently to move the oval-shaped recess out of engagement with the oval-shaped projection. This allows the actuator thereafter to be rotated from its open position to its closed position, to lock the inserted card in place. In its closed position, the actuator's handle 29 serves the added function of locking the lower end of the bulkhead 23 in place.

Figure 5:
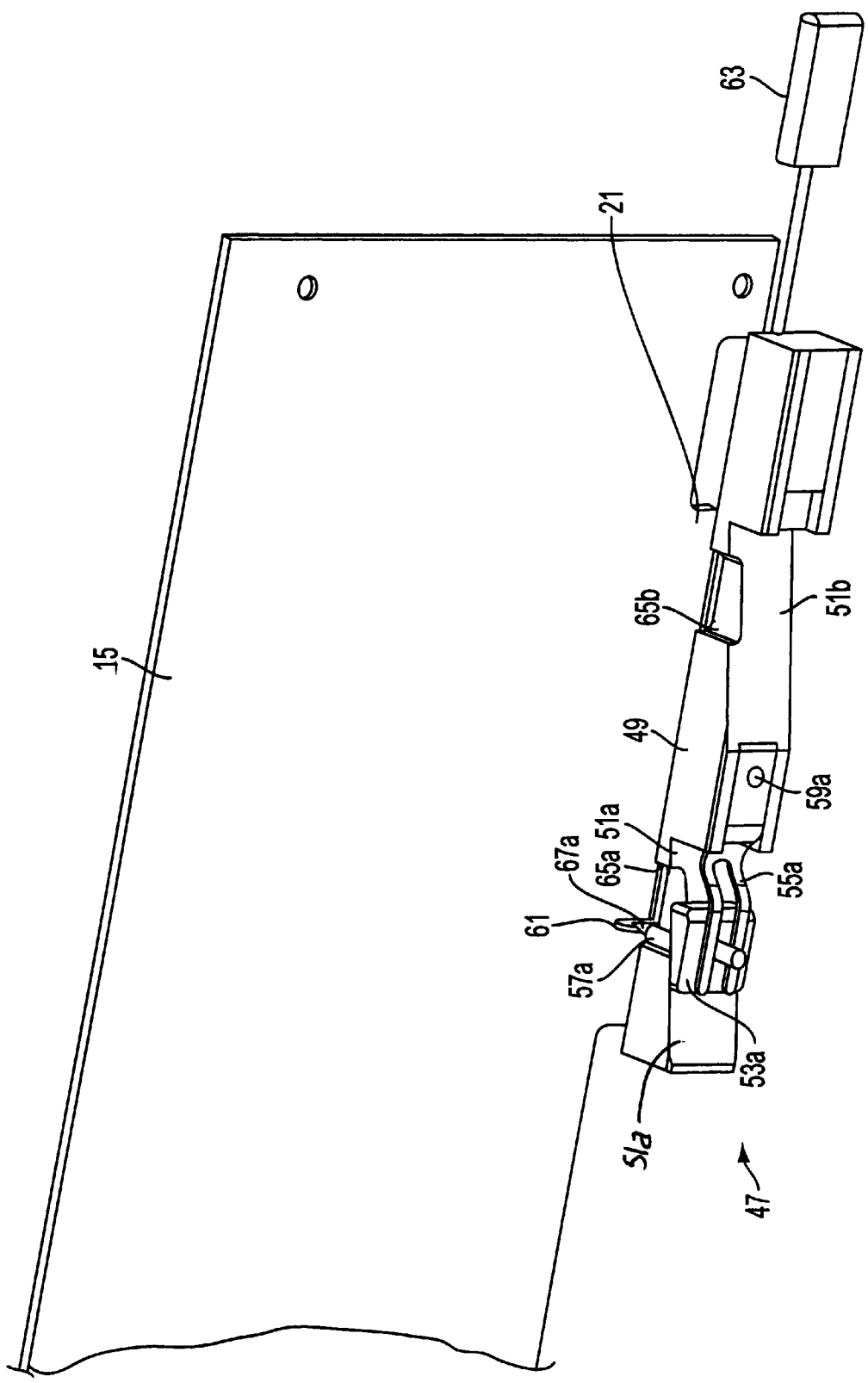
FIG. 5 is an isometric view of a centering assembly that is part of the on-line replacement apparatus of FIG. 1, for fine-positioning a PCI card within one of the chassis connectors, the centering assembly being shown in its open position, in which the card can be freely removed from, or replaced into, the chassis connector.
Figure 6:
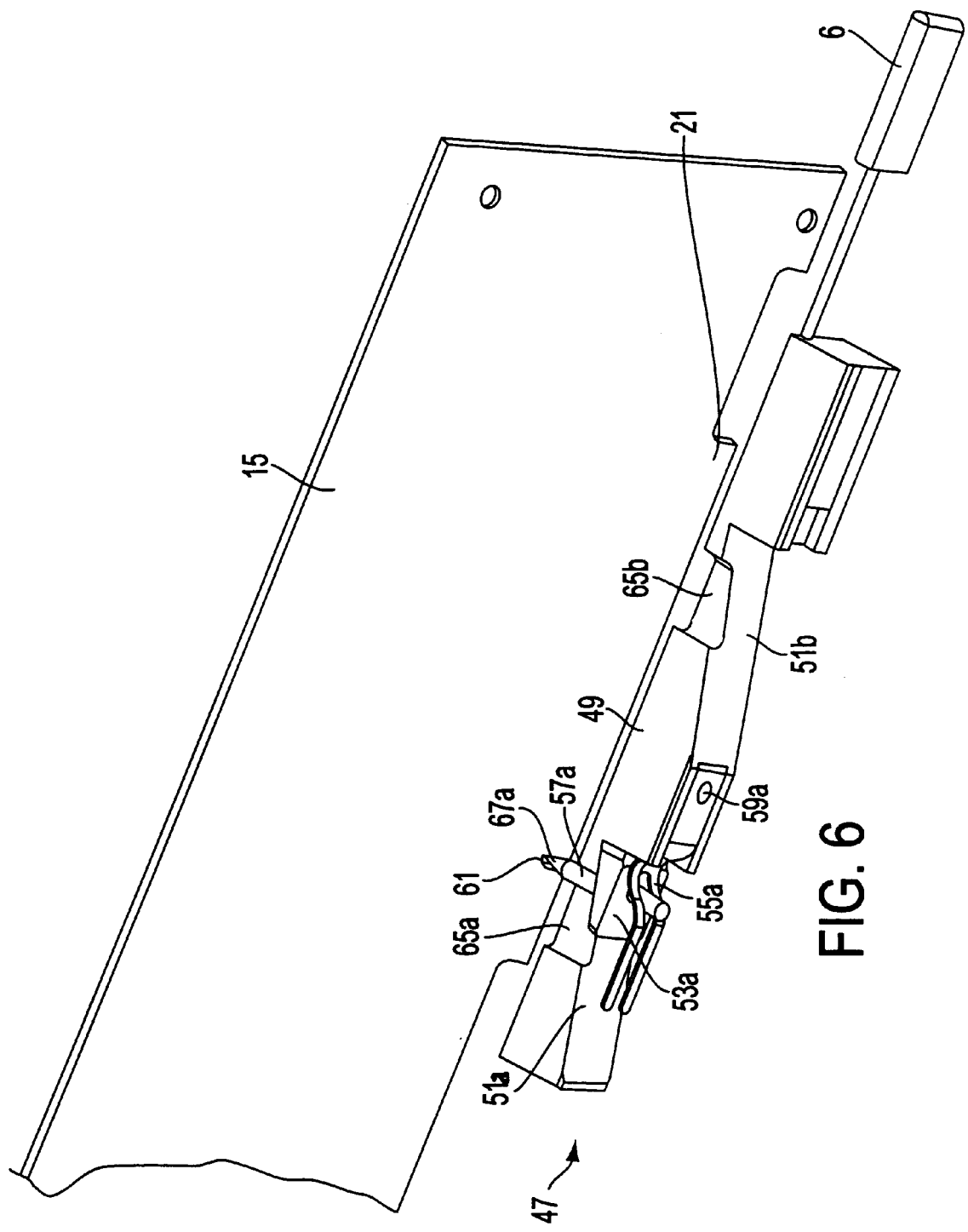
FIG. 6 is an isometric view of the centering assembly of FIG. 5, but shown in its closed position, in which the centering assembly has precisely positioned the PCI card in its prescribed position within the chassis connector.

Even after the PCI card 15 has been fully inserted into the ZIF connector 13, it is important to ensure that the contacts of the ZIF connector are precisely aligned with the corresponding contacts of the PCI card connector 21 before actually rotating the actuator from its open position to its closed position. This precise alignment is achieved by a centering mechanism 47, depicted in FIGS. 5 and 6. The centering mechanism incorporates a slide block 49 mounted for reciprocating movement adjacent to the ZIF connector. The slide block incorporates two cam recesses 51a and 51b on its side facing away from the connector, and a separate wedge is confined within each recess. Only one wedge 53a is depicted in FIGS. 5 and 6, it being in the recess 51a, and the following description refers only to that wedge. It will be understood, however, that a similar-functioning wedge is confined within the recess 51b.

The wedge 53a is confined in place by a spring clip 55a, which is secured to the slide block 49 by any suitable means, e.g., a rivet 59a. The wedge 53a carries a positioning pin 57a that projects toward the ZIF connecter 13, and the spring clip biases the wedge and the positioning pin toward that connector. The recess 51a and its corresponding wedge 53a are positioned such that the positioning pin is engageable with a positioning slot 61 at the lower edge of PCI cards 15 operating at 5 volts. The recess 51b and its corresponding wedge (not shown), on the other hand, are positioned to engage a similar positioning slot (not shown) at the lower edge of PCI cards operating at 3.3 volts.

The slide block 49 incorporates a handle 63 for manually sliding the slide block in a direction parallel with the direction of insertion of the PCI card 15. The wedge 53a is confined to move only in a direction perpendicular to that sliding movement. Thus, as the slide block is slid rearwardly, the wedge is biased by the spring clip 55a to move down the cam recess 51a, such that the positioning pin 57a is caused to project laterally through a cutout 65a in the slide block toward the ZIF connector 13.

When the slide block 49 is in its retracted position (FIG. 5), the positioning pin 57a is retracted sufficiently to allow the PCI card 15 to be inserted into the ZIF connector 13 without contacting the pin. On the other hand, when the slide block is in its extended position (FIG. 6), the pin is extended sufficiently to engage the positioning slot 61 at the lower edge of the PCI card. A conical tip 67a on the positioning pin will effectively adjust the card's position such that the slot and the pin are precisely aligned with each other. In this aligned position, the contacts of the PCI card connector 21 are precisely aligned with the contacts of the ZIF connector.

After the centering mechanism 47 has been used to align the contacts of the PCI card connector 21 with the corresponding contacts of the ZIF connector 13, the actuator 27 can be rotated from its open position to its closed position, to lock the PCI card 15 in place. A manual card locking mechanism 69 mounted on the side wall 19 above the opening 17 then can be actuated, to lock the upper end of the installed card in place. As mentioned above, moving the handle 29 of the actuator 27 to its closed position effectively locks the lower end of the installed card in place.

If the installed PCI card 15 ever becomes faulty, suitable circuitry of the computer system can illuminate a light-emitting diode 71 carried on the side wall 19, adjacent to the opening 17 for the faulty card. The card then can be removed simply by manually unlocking the card locking mechanism 69 and then rotating the control handle 29 of the actuator 27 from its closed position (horizontal) to its open position (vertical). This releases the grip of the contacts of the ZIF connector 13, whereupon the spring bias of the interlock mechanism 37 urges the card outwardly, for convenient removal and replacement.

It should be appreciated from the foregoing description that the present invention provides an improved structure for removing and installing faulty PCI cards laterally through a side wall of a computer system, while the remaining PCI cards of the computer system remain under power and operational. The computer system incorporates ZIF connectors for receiving the PCI cards, and a special interlock mechanism prevents each ZIF connector from being moved from its open position to its closed position until its associated PCI card has been fully installed into the connector. In addition, a special centering mechanism is used to adjustably position the PCI card with its electrical contacts precisely aligned with the contacts of the ZIF connector.

Although the invention has been described in detail with reference only to the preferred embodiment, those of ordinary skill in the art will appreciate that various modification can be made without departing from the invention. Accordingly, the invention is defined only by the following claims.

I claim:

1. Apparatus for removing and installing a printed circuit card from and into a chassis, wherein the printed circuit card has a lower edge, an upper edge opposite the lower edge, and a side edge between the lower edge and upper edge, and wherein the printed circuit card includes a multiple-contact connector located along its lower edge and a bulkhead located along its side edge, wherein the apparatus comprises:

a chassis connector mounted on the chassis and having a plurality of electrical contacts that define a slot for receiving the lower edge of the printed circuit card, wherein the chassis connector contacts are movable between a retracted position, in which the lower edge of the printed circuit card can be slid along the slot without contacting the chassis connector contacts to permit the card to be removed and installed, and an engagement position, in which the chassis connector contacts make electrical contact with the multiple-contact connector of the printed circuit card and secure the card in place;

a control lever for selectively moving the chassis connector contacts between their retracted position and their engagement position; and a mechanical interlock for preventing the control lever from moving the chassis connector contacts from their retracted position to their engagement position unless the printed circuit card has been fully inserted.

2. Apparatus as defined in claim 1, and further comprising a centering device, operable when the printed circuit card has been fully inserted into the chassis connector, for adjustably positioning the printed circuit card such that the printed circuit card contacts are aligned with the corresponding chassis connector contacts.

3. Apparatus as defined in claim 2, wherein the centering device comprises a spring-biased pin configured to engage and to center a key slot formed in a prescribed position at the lower edge of the printed circuit card.

4. Apparatus as defined in claim 3, wherein:

the centering device further comprises a spring configured to bias the pin substantially orthogonally toward the axis of the chassis connector slot; and the pin has a conical section configured to engage the key slot of the printed circuit card and thereby adjustably position the printed circuit card in a prescribed installation position.

5. Apparatus as defined in claim 1, and further comprising an elongated card guide pivotally mounted on the chassis and incorporating a slot configured to engage and retain the upper edge of the printed circuit card.

6. Apparatus as defined in claim 5, and further comprising a spring for biasing the elongated card guide toward the chassis connector.

7. Apparatus as defined in claim 1, wherein the control lever comprises an elongated rod mounted for rotation adjacent to the chassis connector contacts and configured such that rotation of the rod about its longitudinal axis moves the chassis connector contacts between their retracted position and their engagement position.

8. Apparatus as defined in claim 7, wherein the elongated rod has a section with a uniform, substantially oval cross-section, configured to engage the chassis connector contacts.

9. Apparatus as defined in claim 7, wherein:

the mechanical interlock comprises a block mounted on the chassis, adjacent to the chassis connector, and movable between a forward position and a retracted position, and a spring that biases the block to its forward position;

installing the printed circuit card into its prescribed installation position automatically moves the block to its retracted position, against the yielding bias of the spring; and the mechanical interlock is configured to prevent the control lever from moving the chassis connector contacts to their engagement position while the block is in its forward position.

10. Apparatus for removing and installing a printed circuit card from and into a chassis, wherein the printed circuit card has a lower edge, an upper edge opposite the lower edge, and a side edge between the lower edge and upper edge, and wherein the printed circuit card includes a multiple-contact connector located along its lower edge and a bulkhead located along its side edge, wherein the apparatus comprises:

a chassis connector mounted on the chassis and having a plurality of electrical contacts that define a slot for receiving the lower edge of the printed circuit card, wherein the chassis connector contacts are movable between a retracted position, in which the lower edge of the printed circuit card can be slid along the slot without contacting the chassis connector contacts to permit the card to be removed and installed, and an engagement position, in which the chassis connector contacts make electrical contact with the multiple-contact connector of the printed circuit card and secure the card in place;

a control lever for selectively moving the chassis connector contacts between their retracted position and their engagement position; and a centering device, separate from the contacts of the chassis connector and operable when the printed circuit card has been fully inserted into the chassis connector, for adjustably positioning the printed circuit card such that the printed circuit card contacts are aligned with the corresponding chassis connector contacts.

11. Apparatus as defined in claim 10, wherein the centering device comprises a spring-biased pin configured to engage and to center a key slot formed in a prescribed position at the lower edge of the printed circuit card.

12. Apparatus as defined in claim 11, wherein:

the centering device further comprises a spring configured to bias the pin substantially orthogonally toward the axis of the chassis connector slot; and the pin has a conical section configured to engage the key slot of the printed circuit card and thereby adjustably position the printed circuit card in a prescribed installation position.

13. Apparatus as defined in claim 10, and further comprising an elongated card guide pivotally mounted on the chassis and incorporating a slot configured to engage and retain the upper edge of the printed circuit card.

14. Apparatus as defined in claim 13, and further comprising a spring for biasing the elongated card guide toward the chassis connector.

15. Apparatus as defined in claim 10, wherein the control lever comprises an elongated rod mounted for rotation adjacent to the chassis connector contacts and configured such that rotation of the rod about its longitudinal axis moves the chassis connector contacts between their retracted position and their engagement position.

16. Apparatus as defined in claim 15, wherein the elongated rod has a section with a uniform, substantially oval cross-section, configured to engage the chassis connector contacts.

17. Apparatus as defined in claim 10, wherein the apparatus further comprises a mechanical interlock for preventing the control lever from moving the chassis connector contacts from their retracted position to their engagement position unless the printed circuit card has been fully inserted, wherein the mechanical interlock comprises:

- a block mounted on the chassis, adjacent to the chassis connector, and movable between a forward position and a retracted position; and
- a spring that biases the block to its forward position;
- wherein installing the printed circuit card into its prescribed installation position automatically moves the block to its retracted position, against the yielding bias of the spring.

18. A computer system comprising:

a housing;

a plurality of printed circuit cards, each card having a lower edge, an upper edge opposite the lower edge, and a side edge between the lower edge and upper edge, and each card incorporating a multiple-contact connector along its lower edge and a bulkhead along its side edge;

a plurality of elongated zero insertion force (ZIF) connectors mounted in the housing in spaced, parallel relationship, each ZIF connector having a plurality of electrical contacts that define a slot for receiving the lower edge of a printed circuit card, wherein the ZIF connector contacts are movable between a retracted position, in which the lower edge of the printed circuit card can be slid along the slot without contacting the ZIF connector contacts, and an engagement position, in which the ZIF connector contacts make electrical contact with the multiple-contact connector of the printed circuit card and secure the card in place;

a plurality of control levers, each associated with a separate one of the plurality of ZIF connectors, for selectively moving the ZIF connector contacts between their retracted and engagement positions;

a plurality of mechanical interlocks, each associated with a separate one of the ZIF connectors, for preventing the associated control lever from moving the ZIF connector contacts from their retracted position to their engagement position unless a printed circuit card has been fully inserted therein; and a plurality of centering devices, each associated with a separate one of the ZIF connectors, and each operable when a printed circuit card has been fully inserted into the ZIF connector, for adjustably positioning the printed circuit card such that the printed circuit card contacts are aligned with the corresponding ZIF connector contacts.

19. A computer system as defined in claim 18, and further comprising a plurality of elongated card guides, each associated with a separate ZIF connector, and each pivotally mounted on the housing and incorporating a slot configured to engage and retain the upper edge of a printed circuit card.

20. Apparatus as defined in claim 19, and further comprising a plurality of springs, each configured to bias a separate one of the elongated card guides toward its associated ZIF connector.

\* \* \* \* \*